United States Patent [19]

Kelleher et al.

[11] Patent Number: 5,734,197
[45] Date of Patent: Mar. 31, 1998

[54] DEFORMABLE LEADFRAME FOR OVERCURRENT PROTECTION

[75] Inventors: Harold T. Kelleher, Attleboro; David W. West, Pembroke, both of Mass.

[73] Assignee: Texas Instruments Incorporated, Dallas, Tex.

[21] Appl. No.: 720,341

[22] Filed: Sep. 27, 1996

Related U.S. Application Data

[60] Provisional application No. 60/005,050, Sep. 27, 1995.
[51] Int. Cl.⁶ ............................................. H01L 23/495
[52] U.S. Cl. ............................................. 257/666; 257/677
[58] Field of Search .................................. 257/666, 669, 257/674, 677, 529

[56] References Cited

U.S. PATENT DOCUMENTS 4,851,894  7/1989  de Ferron et al. ............... 257/529

Primary Examiner—Mahshid D. Saadat
Assistant Examiner—S. V. Clark
Attorney, Agent, or Firm—Alan K. Stewart; W. James Brady, III; Richard L. Donaldson

[57] ABSTRACT

A leadframe (10) for diverting current to an adjacent conductor (55) when a current in the leadframe (10) exceeds a predetermined level includes a first portion (12) for carrying a chip (13) in which an integrated circuit has been constructed. A second portion (20) is connected to receive a current that flows through at least a portion of the integrated circuit. The second portion (20), which may include a bimetallic portion (40,41), is physically deformed by the current and is located to contact the adjacent conductor (55) when the current reaches the predetermined magnitude.

10 Claims, 1 Drawing Sheet

5,734,197

DEFORMABLE LEADFRAME FOR OVERCURRENT PROTECTION

This application claims priority under 35 USC §119(e)(1) of provisional application Ser. No. 60/005,050, filed Sep. 27, 1995.

BACKGROUND OF THE INVENTION

1. Field of the Invention

This invention relates to improvements in integrated circuit packaging techniques, and more particularly to improvements in leadframes for use in integrated circuit packages, and still more particularly to improvements in overcurrent detecting techniques for use with integrated circuits and integrated circuit packages.

2. Relevant Background

The increased power handling capacity and continuing size reductions of electronic components has led to increasing demands on the packaging component of the electronics. Moreover, as integrated circuits become ever increasingly smaller and more complex, the price of many individual chips has increased, sometimes to levels of several hundred dollars, or more. If such chips are subjected to incorrect supply voltages, for example, due to malfunctions of accompanying support circuits or improper voltage regulation circuits, the expensive chip may easily be damaged or destroyed. Consequently, inexpensive means have been sought to protect such chips. Generally separate power supply protection circuits are employed, generally designed as a part of the overall circuit into which the expensive chip is to be incorporated.

Traditional discrete component electronic circuits have long utilized a "circuit breaker" device, one well known variation of which is the bimetallic disk that functions by converting heat generated by current flow into a mechanical motion that under known current or voltage overload conditions reroutes the current to protect sensitive and costly components from damage.

SUMMARY OF THE INVENTION

In light of the above, therefore, it is an object of this invention to provide an improved integrated circuit leadframe.

It is another object of the invention to provide an improved leadframe of the type described that incorporates circuit protection functions that are normally provided by separate electronic components.

It is another object of the invention to provide an improved leadframe of the type described that incorporates more electronic functionality into a smaller area.

It another the object of this invention to incorporate the circuit protection features of a bimetal disk into the integrated circuit leadframe itself by fabricating all or part of the leadframe from bimetallic base alloy and modifying the geometric shape of the leadframe or leadframe lead tips as required.

These and other objects, features, and advantages will become apparent to those skilled in the art from the following detailed description, when read in conjunction with the accompanying drawings and appended claims.

According to a broad aspect of the invention, a leadframe for diverting current to an adjacent conductor when a current in the leadframe exceeds a predetermined level is presented. The leadframe includes a first portion for carrying a chip in which an integrated circuit has been constructed. A second portion is connected to receive a current that flows through at least a portion of the integrated circuit. The second portion, which may be a bimetallic portion, is physically deformed by the current and is located to contact the adjacent conductor when the current reaches the predetermined magnitude.

According to another broad aspect of the invention, a leadframe for carrying an integrated circuit chip, is presented. The leadframe has a first portion for providing a current flow path and a second portion connected to receive a current that flows through at least a portion of said integrated circuit chip. The second portion, which may be a bimetallic portion, is constructed to deform in response to a magnitude of the current. The second portion is located to contact the first portion when the second portion is deformed by said current reaching a predetermined magnitude.

According to another broad aspect of the invention, an integrated circuit package is presented that has a leadframe for carrying an integrated circuit chip. A first portion of the leadframe is adapted for providing a current flow path, and a second portion of the leadframe is connected to receive a current that flows through at least a portion of the integrated circuit chip. The second portion is constructed to deform in response to a magnitude of the current, and may be, for instance, a bimetallic portion. An encapsulating package surrounds at least a portion of the leadframe and the integrated circuit chip. The encapsulating package has a conducting portion located to contact the second portion of the leadframe when the second portion is deformed by the current reaching a predetermined magnitude. In one embodiment, the encapsulating package is a cavity-type package. A current limiting resistor may be connected between the portion of the leadframe and ground.

BRIEF DESCRIPTION OF THE DRAWINGS

The invention is illustrated in the accompanying drawings, in which.

In the various figures of the drawings, like reference numerals are used to denote like or similar parts.

DETAILED DESCRIPTION OF THE PREFERRED EMBODIMENTS

The invention provides a structure for use in the packaging of an integrated circuit or other similar electronic component by which all or a portion of current in excess of a predetermined value is shunted or diverted to protect the electronic circuit.

Figure 1:
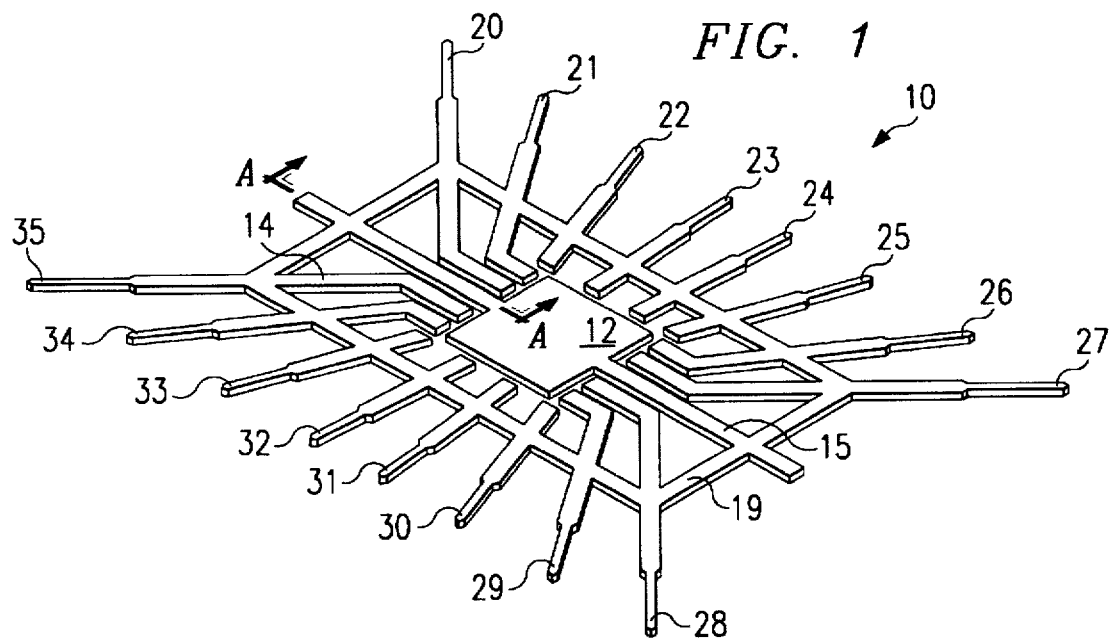
FIG. 1 is a perspective view of leadframe prior to use, used for carrying an integrated circuit chip in accordance with a preferred embodiment of the invention.

A perspective view of a leadframe 10 that is constructed according to the invention is shown in FIG. 1. It should be noted that the leadframe 10 shown is exemplary only for explanation of the principles of the invention, and can be of any layout or configuration, as needed for the particular application in which it is to be used. Thus, for illustration, the particular leadframe 10 illustrated is similar to that which may be used to mount an integrated circuit in an eight lead dual-in-line package.

Figure 2:
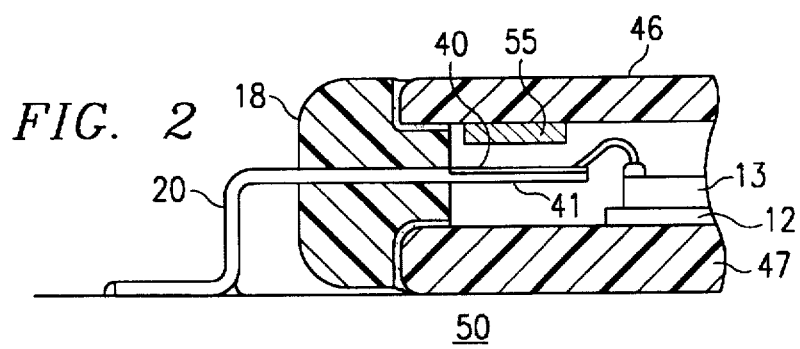
FIG. 2 is a side elevation view of a portion of a cavity-type package into which the leadframe of FIG. 1, seen at A—A, has been incorporated, in accordance with a preferred embodiment of the invention, showing the normal configuration of a deformable leadframe member.
Figure 3:
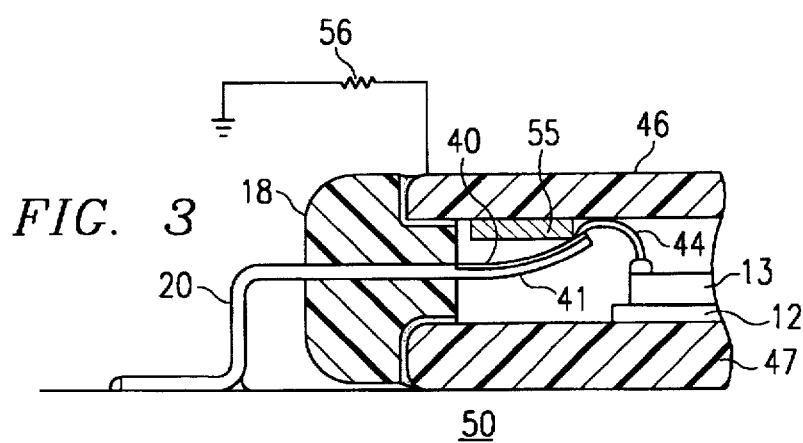
FIG. 3 is a side elevation view of the cavity-type package of FIG. 2, showing the current bypass position of the deformable leadframe member.

The leadframe 10 has a centrally located pad 12 to which an integrated circuit chip 13 (shown in FIGS. 2 and 3) may be affixed. The pad 12 is carried by leads 14 and 15, which are used to support the pad 12 until the leadframe and chip are encapsulated in an encapsulating compound or material 18. A temporary supporting line 19 surrounds the various members of the leadframe 10. (It is noted that the plane of the pad 12 may be displaced from the plane of the remaining leadframe members, as in the embodiment shown in FIGS. 2 and 3, although, as mentioned, the construction of the leadframe may be essentially as desired for the particular application in which it is to be used.) The temporary supporting line 19 will be sheared or otherwise removed after encapsulation, in a manner known in the art, as shown in FIGS. 2 and 3. A number of leads 20–35 that will form the pins for the integrated circuit package extend outwardly from the central pad 12. The leads 20–35 also are supported by the temporary lead 19 in FIG. 1.

According to the invention, one or more of the leads 20–35 is made of a metal composition that is deformable when heated, for example by a current passing through the composition. One embodiment of such deformable composition is a bimetallic composition that is heated in relation to the magnitude of current flowing there through, and which also deforms in relation to the magnitude of the heat. Bimetallic compositions are known in the art, and those skilled in the art will readily recognize those that are suitable for use in integrated circuit packaging applications. One such composition, for example, may be a layer of tungsten 40 formed over a copper leadframe material 41, as shown in FIGS. 2 and 3.

The particular lead that is selected for construction with the deformable material may be any that conducts current to integrated circuit components that are desired to be protected from overcurrent conditions. For example, one pin that may be advantageously selected is the pin 20 to which $V_{cc}$ will be applied in use of the integrated circuit to limit the maximum current to which the integrated circuit will be subjected.

In the operation of the leadframe with deformable portions, as the current approaches an undesirably high level, the deformable portion bends to contact a current diverting element or member. For example, with reference now to FIG. 2, the leadframe is mounted in a package, with the various leads 20–35 connected to desired portions of the integrated circuit 13 by wires. In the embodiment shown in FIGS. 2 and 3, for instance, the lead 20 is connected to a desired portion of the integrated circuit 13 by a wire 44 of sufficient length to allow the member 20 to deform without breaking the wire 44 or its connections to the integrated circuit 14 or lead 20, yet not of such length as to short to the top or sidewalls of the package. As is typical, the lead 44 may be attached to the integrated circuit 13 by a ball bond and to the lead 20 by a stitch bond.

The package may conveniently be of the "cavity" type, such as those described by Helmick et al., "More Power in Less Space: A Thermal Enhancement Solution for Thin Packages," *TI Technical Journal*, July–August, 1994, said article being incorporated herein by reference. Thus, the package has conductive top 46 and bottom 47 members, and surrounding sidewall insulating compound 18. The package, in use, is mounted to an appropriate substrate 50, which may be a printed circuit board, or the like. The leads may be bent and soldered to the desired locations of the substrate 50, as shown, in a manner known in the art.

As shown in FIG. 3, when an overcurrent condition exists, the lead 20 deforms to contact the conductive top 46. Preferably, a conductive pad 55 is provided in electrical contact with the top 46 for contacting the lead 20 in its deformed state. The pad 55 may be dimensioned so that it contacts the lead 20 at the predetermined overcurrent magnitude, and configured to contact the lead 20 when it is deformed, without contacting or damaging the wire 44. Although the bimetallic portion of the lead 20 is shown configured to the inner end of the lead, the bimetallic portion can have other suitable configurations, as well. For example, the lead 20 may have only a portion of the interior lead configured with a bimetallic portion, so that when an overcurrent condition exists, the lead 20 deforms in a manner similar to a "bimetal disk" type circuit breaker, with a central protruding area or distended portion that extends to contact the current diverting member.

In order to divert the current from the lead 20, the conducting top 46 of the package may be connected to ground, preferably through a current limiting resistor 56, schematically shown in FIG. 3. If desired, the current limiting resistor 56 may be sized to divert only a particular predetermined portion of the overcurrent.

Although the invention has been described and illustrated with a certain degree of particularity, it will be understood that the present disclosure has been made only by way of example, and that numerous changes in the combination and arrangement of parts will be apparent to those skilled in the art without departing from the spirit and scope of the invention as hereinafter claimed.

We claim:

1. A leadframe for diverting current to an adjacent conductor when a current in the leadframe exceeds a predetermined level, comprising:

a first portion for carrying a chip in which a integrated circuit has been constructed;

and a second portion connected to receive a current that flows through at least a portion of said integrated circuit, said second portion being physically deformed by said current and being located to contact said adjacent conductor when said current reaches the predetermined magnitude.

2. The leadframe of claim 1 wherein second portion comprises a bimetallic portion.

3. A leadframe for carrying an integrated circuit chip, comprising:

a first portion for providing a current flow path;

and a second portion connected to receive a current that flows through at least a portion of said integrated circuit chip, said second portion being constructed to deform in response to a magnitude of the current, said second portion being located to contact said first portion when said second portion is deformed by said current reaching a predetermined magnitude.

4. The leadframe of claim 3 wherein second portion comprises a bimetallic portion.

5. The leadframe of claim 4 wherein said bimetallic portion comprises a first portion of tungsten and a second layer of copper.

6. An integrated circuit package, comprising:

a leadframe for carrying an integrated circuit chip;

a first portion of said leadframe being adapted for providing a current flow path;

a second portion of said leadframe being connected to receive a current that flows through at least a portion of said integrated circuit chip, said second portion being constructed to deform in response to a magnitude of the current;

an encapsulating package surrounding at least a portion of said leadframe and said integrated circuit chip;

said encapsulating package having an electrically conducting portion located to contact said second portion of said leadframe when said second portion is deformed by said current reaching a predetermined magnitude.

7. The leadframe of claim 6 wherein second portion of said leadframe comprises a bimetallic portion.

8. The leadframe of claim 7 wherein said bimetallic portion comprises a first layer of tungsten and a second layer of copper.

9. The leadframe of claim 6 wherein said encapsulating package is a cavity-type package.

10. The leadframe of claim 6 further comprising a current limiting resistor connected between said portion of said leadframe and ground.

* * * * *